United States Patent
Liu

(10) Patent No.: US 9,802,326 B2
(45) Date of Patent: Oct. 31, 2017

(54) SHEET GLASS ALIGNMENT SYSTEM

(71) Applicant: Shenzhen China Star Optoelectronics Technology Co., Ltd., Shenzhen, Guangdong (CN)

(72) Inventor: Yawei Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 99 days.

(21) Appl. No.: 14/430,210

(22) PCT Filed: Sep. 19, 2014

(86) PCT No.: PCT/CN2014/086882
§ 371 (c)(1),
(2) Date: Mar. 20, 2015

(87) PCT Pub. No.: WO2016/029522
PCT Pub. Date: Mar. 3, 2016

(65) Prior Publication Data
US 2016/0271804 A1    Sep. 22, 2016

(30) Foreign Application Priority Data

Aug. 26, 2014 (CN) .......................... 2014 1 0424291

(51) Int. Cl.
*B25J 15/06* (2006.01)
*G02F 1/1333* (2006.01)
(Continued)

(52) U.S. Cl.
CPC ........ *B25J 15/0616* (2013.01); *G02F 1/1303* (2013.01); *G02F 1/1333* (2013.01);
(Continued)

(58) Field of Classification Search
CPC .. B25J 15/065–15/0666; B25J 15/0616; G02F 2001/133354; H01L 51/0012
See application file for complete search history.

(56) References Cited

U.S. PATENT DOCUMENTS 6,139,078 A * 10/2000 Bodiker, II .......... B25J 15/0616
29/743
6,439,559 B1 * 8/2002 Kinnard ................ B25B 11/007
269/21

(Continued)

*Primary Examiner* — Larry E Waggle, Jr.
*Assistant Examiner* — Henry Hong
(74) *Attorney, Agent, or Firm* — Andrew C. Cheng

(57) ABSTRACT

The present invention provides a sheet glass alignment system. The sheet glass alignment system comprises: an upper alignment platform and a lower alignment platform (1, 3) which are oppositely located; the upper alignment platform (1) is capable of moving up and down relative to the lower alignment platform (3); the upper alignment platform and the lower alignment platform (1, 3) respectively comprise a plurality of first and second stepped holes (13, 33) penetrating upper and lower surfaces thereof, and each of the first stepped holes (13) comprises a first wide portion (131) facing the lower alignment platform (3) and a first narrow portion (132) connecting to the first wide portion (131), and each of the second stepped holes (33) comprises a second wide portion (331) facing the upper alignment platform (1) and a second narrow portion (332) connecting to the second wide portion (331); first and second sucking discs are respectively installed on the first and the second wide portions (131, 331); a plurality of first and second push rods (19, 39) are respectively inserted into the plurality of first and second stepped holes (13, 33) and capable of moving up and down along axes of the plurality of first and second stepped holes (13, 33) where the plurality of first and second push rods (19, 39) are positioned therein.

8 Claims, 11 Drawing Sheets

(51) Int. Cl.
   *H01L 51/00* (2006.01)
   *G02F 1/13* (2006.01)

(52) U.S. Cl.
   CPC ............... *H01L 51/0012* (2013.01); *G02F 2001/133354* (2013.01); *H01L 51/0024* (2013.01)

(56) References Cited

U.S. PATENT DOCUMENTS

| | | | |
|---|---|---|---|
| 9,120,232 B1* | 9/2015 | Wong | B25J 15/0616 |
| 2002/0002025 A1* | 1/2002 | Chen | B24B 37/30 |
| | | | 451/8 |
| 2012/0193500 A1* | 8/2012 | Kniss | B25B 11/007 |
| | | | 248/363 |
| 2015/0214085 A1* | 7/2015 | Jin | H01L 21/6838 |
| | | | 414/806 |

* cited by examiner

US 9,802,326 B2

SHEET GLASS ALIGNMENT SYSTEM

FIELD OF THE INVENTION

The present invention relates to a display technology field, and more particularly to a sheet glass alignment system.

BACKGROUND OF THE INVENTION

Liquid Crystal Display (LCD), Organic Light Emitting Diode (OLED) and other flat panel displays have been gradually replaced the CRT displays and become a mainstream of the display devices. The LCD or the OLED is generally manufactured on a sheet glass (such as a sheet glass having a 0.5 mm thickness). In the manufacture processes of the LCD or the OLED, a process of aligning the two sheet glasses and gluing the two for implementing package to the LCD or the OLED is required. The machine employed for this process is so called VAS (Vacuum Alignment System).

Please refer from FIG. 1 to FIG. 3. The sheet glass alignment system according to prior art comprises: an upper alignment platform 100 and a lower alignment platform 300 which are oppositely located, and the upper alignment platform 100 is capable of moving up and down relative to the lower alignment platform 300; the upper alignment platform 100 comprises a plurality of first air holes 110, penetrating upper and lower surfaces of the upper alignment platform 100, and being arranged in array, a plurality of first stepped holes 130 penetrating upper and lower surfaces of the upper alignment platform 100 and offsetting from the first air holes 110, first fitting seats 150 fixedly located in the wide portions 134 at the bottoms of the first stepped holes 130, first sucking discs 170 installed on the first fitting seats 150 and first rubber elements 190 installed on the first fitting seats 150 inside the first sucking discs 170; the first rubber elements 190 are hollow and the thickness is smaller. Each of them comprises an open, and the open is connected to the first stepped hole 130 through the central hole of the first fitting seat 150. The structure of the lower alignment platform 300 is opposite to the upper alignment platform 100, and it comprises a plurality of second air holes 310, penetrating upper and lower surfaces of the lower alignment platform 300, and being arranged in array, a plurality of second stepped holes 130 penetrating upper and lower surfaces of the lower alignment platform 300 and offsetting from the second air holes 310, second fitting seats 350 fixedly located in the wide portions 334 at the tops of the second stepped holes 330, second sucking discs 370 installed on the second fitting seats 350 and second rubber elements 390 installed on the second fitting seats 350 inside the second sucking discs 370; the second rubber elements 390 are hollow and the thickness is smaller. Each of them comprises an open, and the open is connected to the second stepped hole 330 through the central hole of the second fitting seat 350.

The sheet glass alignment method utilizing the aforesaid sheet glass alignment system comprises steps of:

step 1, providing an upper substrate 200 and a lower substrate 400 to be aligned;

step 2, a robot arm is employed to transfer the upper substrate 200 right below the upper alignment platform 100; and the robot arm lifts the upper substrate 200 upward, and meanwhile, the first air holes 110 are vacuumed to attach the upper substrate 200 to the upper alignment platform 100; finally, the robot arm is moved out and the first air holes 110 are charged to return to 1 atm, and the upper substrate 200 is attached by the first sucking discs 170;

step 3, a robot arm is employed to transfer the lower substrate 400 right above the lower alignment platform 300; and the robot arm descends the lower substrate 400 downward, and meanwhile, the second air holes 310 are vacuumed to attach the lower substrate 400 to the lower alignment platform 300; finally, the robot arm is moved out and the second air holes 310 are charged to return to 1 atm, and the lower substrate 400 is attached by the second sucking discs 370;

step 4, please refer to FIG. 4, slowly moving the upper alignment platform 100 downward until the upper substrate 200 and the lower substrate 400 are aligned;

step 5, please refer to FIG. 5, respectively charging the first and the second rubber elements 190, 390 through the first and the second stepped holes 130, 330, to bubble the first and the second rubber elements 190, 390. Ultimately, the upper substrate 200 and the lower substrate 400 are removed away from the first and the second sucking discs 170, 370;

step 6, lifting the upper alignment platform 100 to return back to the original position;

step 7, extracting out the upper and the lower substrates 2, 4 which have been aligned with the robot arm.

In the sheet glass alignment method according to prior art, the method of bubbling is employed to move the upper and the lower substrates 200, 400 away from the upper and the lower alignment platforms 100, 300. The advantage of such method is that the structure is simple and the operation is easy. The drawback is the ages of the first and the second rubber elements 190, 390. Just like the hydrogen balloons, they will be deformed after the repeated charges and discharges many times. As shown in FIG. 5, if the age degrees of the first and the second rubber elements 190, 390 are different, it leads to that some bubbles will large and some bubbles will be small under the same pressure. The pressure applied to the upper substrate 200 or the lower substrate 400 can be uneven to cause that the pressures to some positions of the upper and the lower substrates 200, 400 are large and the pressures to some positions might be small. According bends and deformations occur to decrease the production yield of the panel display devices.

SUMMARY OF THE INVENTION

An objective of the present invention is to provide a sheet glass alignment system for improving the present sheet glass alignment system to make the pressure is evenly distributed when the upper and the lower substrates are detached from the alignment platforms for raising the production yield of the panel display devices.

For realizing the aforesaid objective, the present invention provides a sheet glass alignment system, comprising: an upper alignment platform and a lower alignment platform which are oppositely located; the upper alignment platform is capable of moving up and down relative to the lower alignment platform;

the upper alignment platform comprises a plurality of first stepped holes penetrating upper and lower surfaces of the upper alignment platform, and each of the first stepped holes comprises a first wide portion facing the lower alignment platform and a first narrow portion connecting to the first wide portion, and each of the first wide portions is installed with a first sucking disc, and a plurality of first push rods is respectively inserted into the plurality of first stepped holes, and each of the first push rods is capable of moving up and down along an axis of the first stepped hole where the first push rod is positioned therein;

the lower alignment platform comprises a plurality of second stepped holes penetrating upper and lower surfaces of the lower alignment platform, and each of the second stepped holes comprises a second wide portion facing the upper alignment platform and a second narrow portion connecting to the second wide portion, and each of the second wide portions is installed with a second sucking disc, and a plurality of second push rods is respectively inserted into the plurality of second stepped holes, and each of the second push rods is capable of moving up and down along an axis of the second stepped hole where the second push rod is positioned therein the upper alignment platform further comprises a plurality of first air holes, penetrating upper and lower surfaces of the upper alignment platform, and being arranged in array, and the first wide portion of each of the first stepped holes is installed with a first fitting seat, and the first sucking disc is installed on the first fitting seat; the first fitting seat comprises a first central hole, and the first central hole and the first stepped hole are connected;

the lower alignment platform further comprises a plurality of second air holes, penetrating upper and lower surfaces of the lower alignment platform, and being arranged in array, and the second wide portion of each of the second stepped holes is installed with a second fitting seat, and the second sucking disc is installed on the second fitting seat; the second fitting seat comprises a second central hole, and the second central hole and the second stepped hole are connected.

The plurality of first stepped holes is symmetrically arranged according to a center of the upper alignment platform; the plurality of second stepped holes is symmetrically arranged according to a center of the lower alignment platform.

One end of the first push rod close to the first wide portion of the first stepped hole is connected to a first bearer, the other end of the first push rod is connected to a first servo step motor; one end of the second push rod close to the second wide portion of the second stepped hole is connected to a second bearer, the other end of the second push rod is connected to a second servo step motor.

Material of the first and the second push rods is stainless steel, and material of the first and the second bearers is plastic, and material of the first and the second sucking discs is rubber.

The benefits of the present invention are: according to the sheet glass alignment system provided by the present invention, by providing a plurality of push rods to replace the rubber elements for bubbling to make the pressure is evenly distributed when the upper and the lower substrates are detached from the alignment platforms for raising the production yield of the panel display devices.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
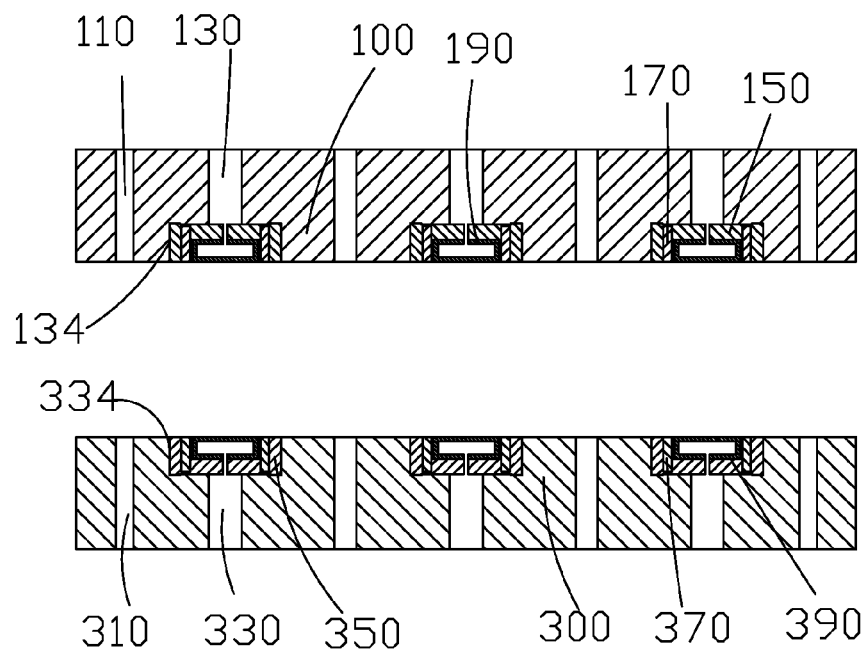
FIG. 1 is a sectional diagram of a sheet glass alignment system according to prior art.
Figure 2:
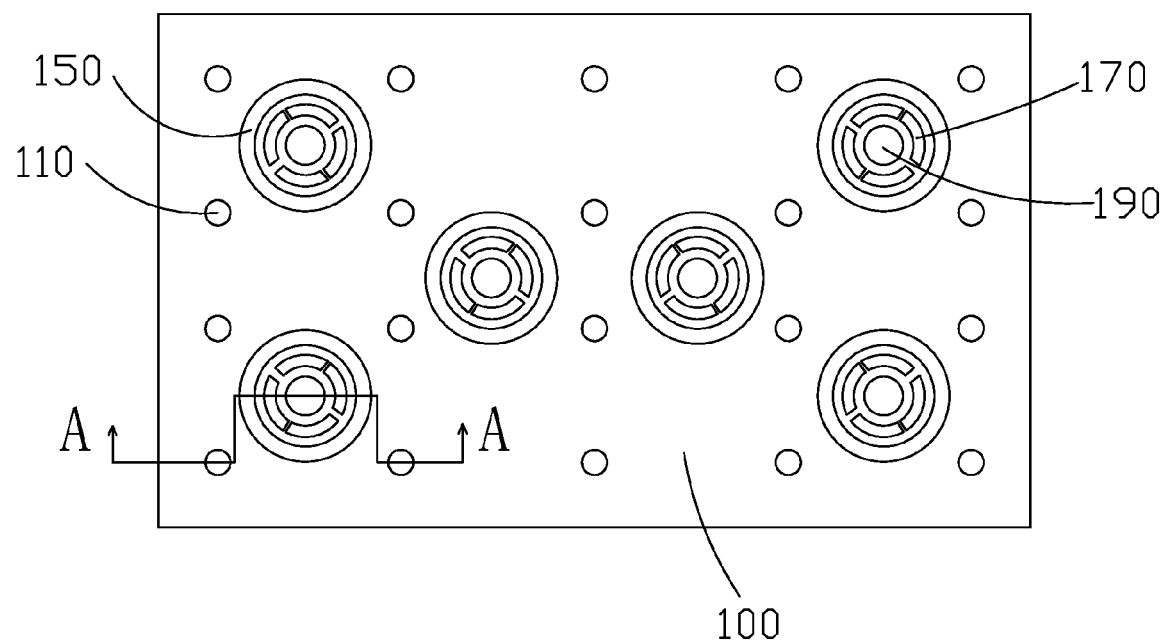
FIG. 2 is a top view diagram of an upper alignment platform in the sheet glass alignment system according to prior art.
Figure 3:
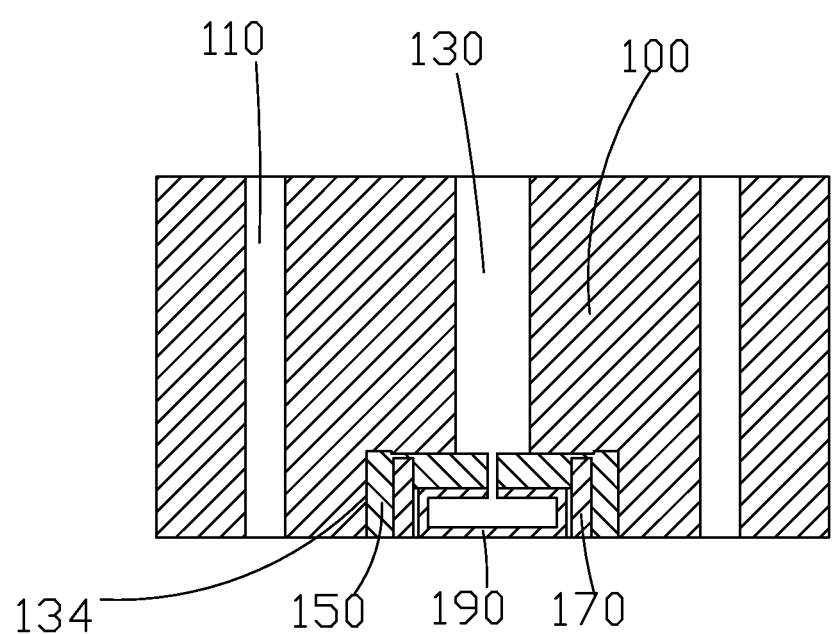
FIG. 3 is a rotated sectional diagram in accordance with the A-A line in FIG. 2.
Figure 4:
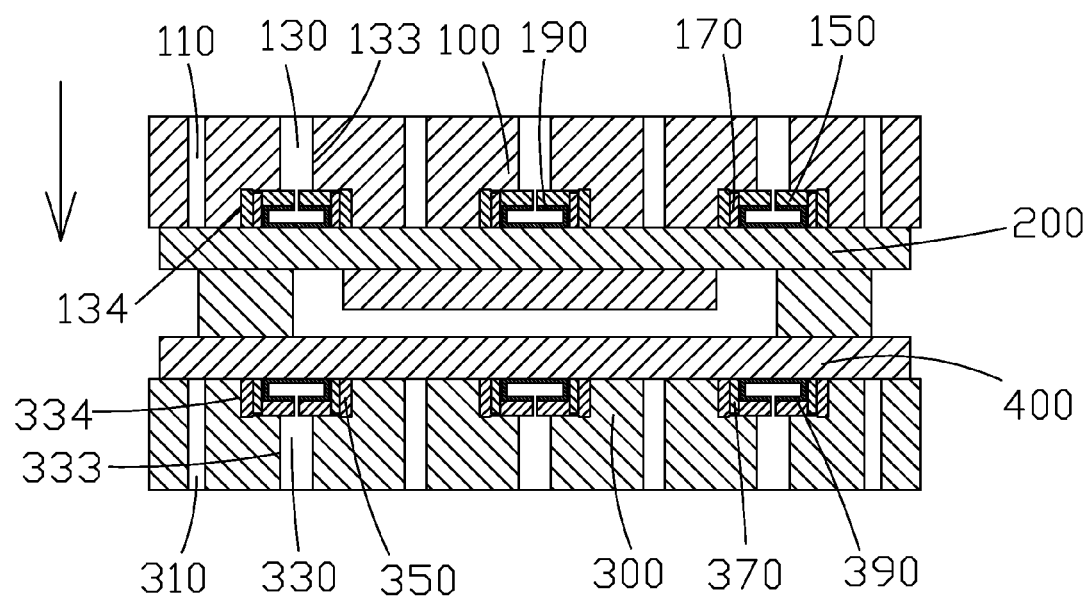
FIG. 4 is a diagram of step 4 of the sheet glass alignment system according to prior art.
Figure 5:
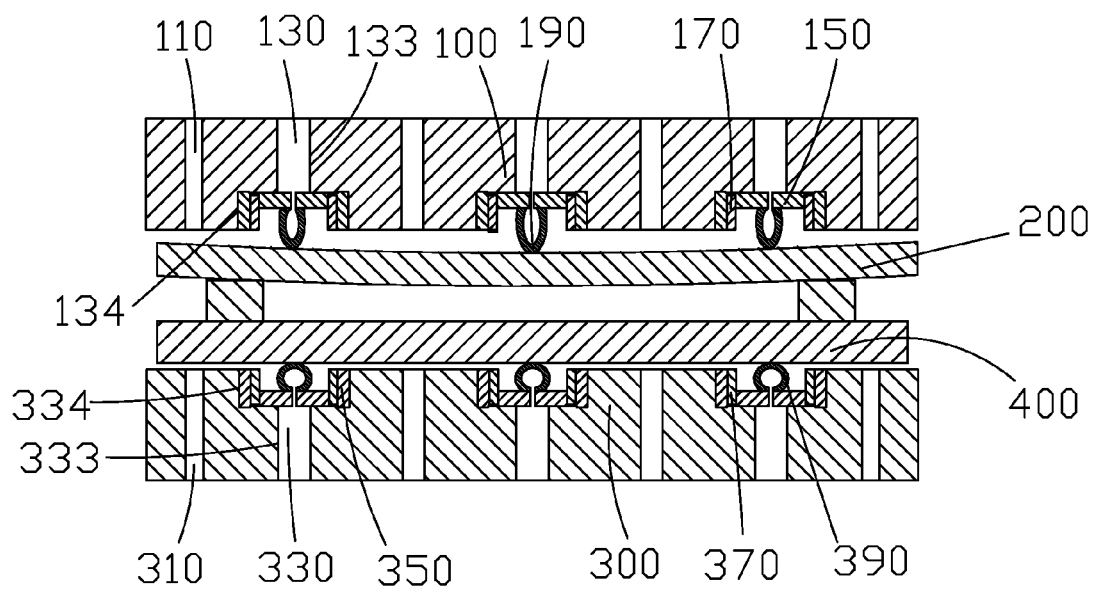
FIG. 5 is a diagram of step 5 of the sheet glass alignment system according to prior art.
Figure 6:
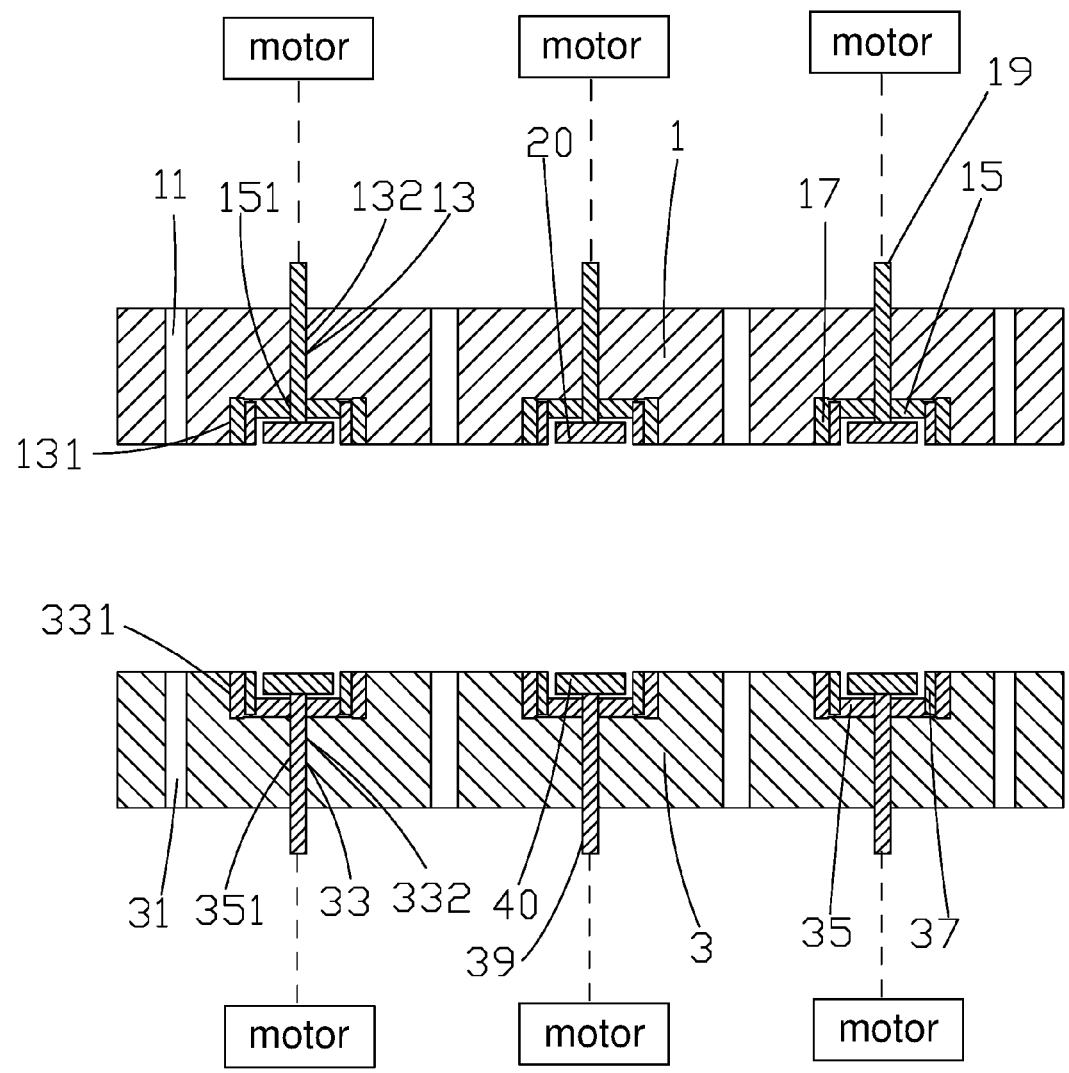
FIG. 6 is sectional diagram of a sheet glass alignment system according to the present invention.
Figure 7:
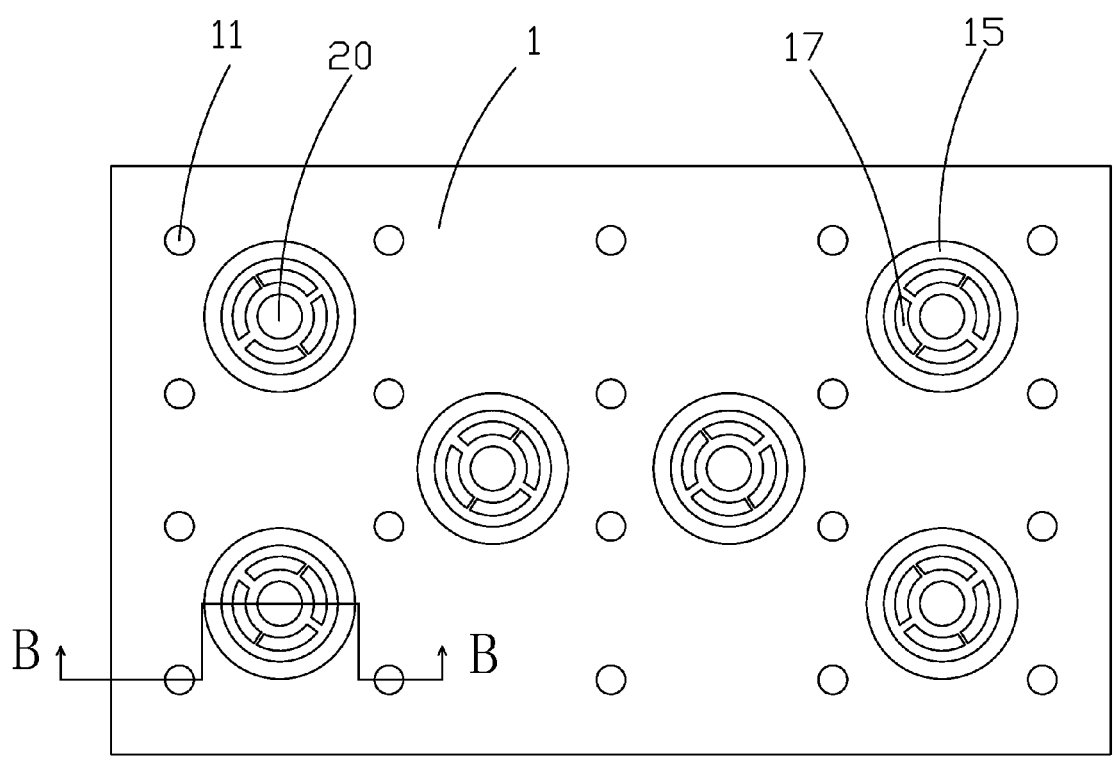
FIG. 7 is a top view diagram of an upper alignment platform in the sheet glass alignment system according to the present invention.
Figure 8:
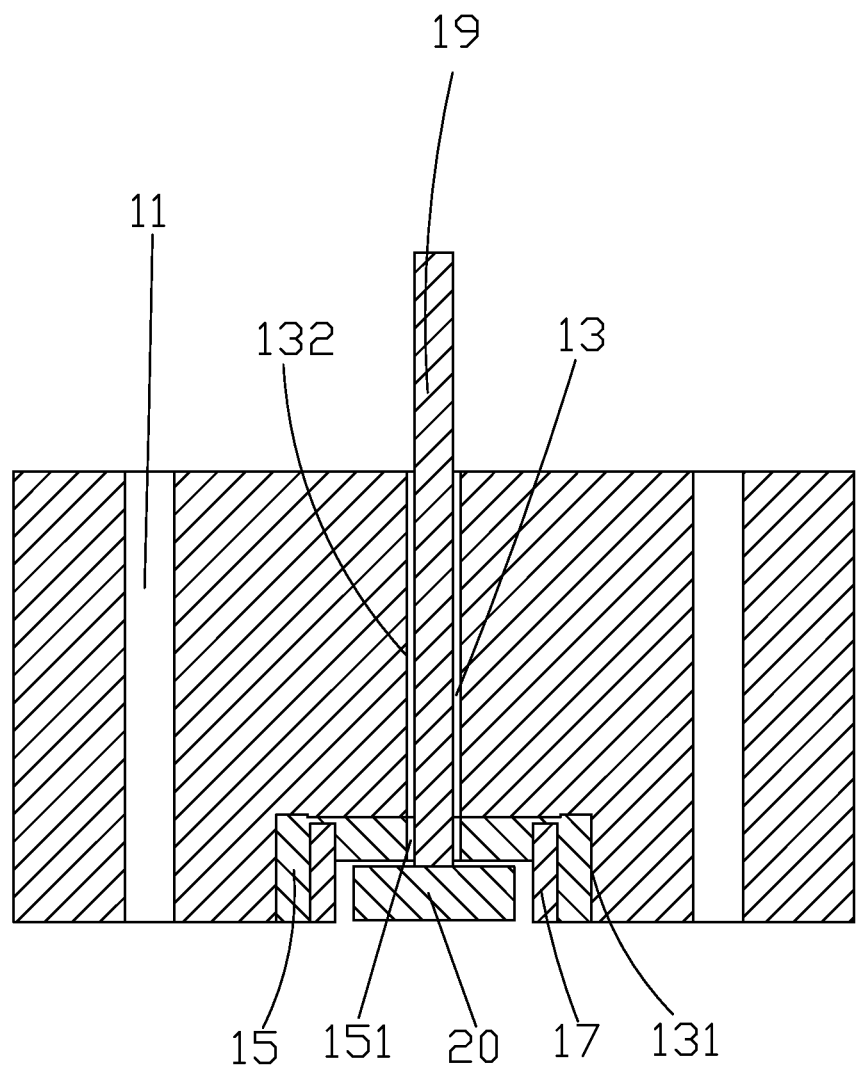
FIG. 8 is a rotated sectional diagram in accordance with the B-B line in FIG. 7.

Please refer from FIG. 6 to FIG. 8. The present invention provides a sheet glass alignment system, comprising: an upper alignment platform 1 and a lower alignment platform 3 which are oppositely located; the upper alignment platform 1 is capable of moving up and down relative to the lower alignment platform 3 and driven by with a power plant (not shown).

The upper alignment platform 1 comprises a plurality of first stepped holes 13 penetrating upper and lower surfaces thereof, and each of the first stepped holes 13 comprises a first wide portion 131 facing the lower alignment platform 3 and a first narrow portion 132 connecting to the first wide portion 131, and each of the first wide portions 131 is installed with a first sucking disc 17, and a plurality of first push rods 19 is respectively inserted into the plurality of first stepped holes 13, and each of the first push rods 19 is capable of moving up and down along an axis of the first stepped hole 13 where the first push rod 19 is positioned therein; the upper alignment platform 1 further comprises a plurality of first air holes 11, penetrating upper and lower surfaces thereof, and being arranged in array, the first wide portion 131 of each of the first stepped holes 13 is installed with a first fitting seat 15, and the first sucking disc 17 is installed on the first fitting seat 15; the first fitting seat 15 comprises a first central hole 151, and the first central hole 151 and the first stepped hole 13 are connected.

The lower alignment platform 3 comprises a plurality of second stepped holes 33 penetrating upper and lower surfaces thereof, and each of the second stepped holes 33 comprises a second wide portion 331 facing the upper alignment platform 1 and a second narrow portion 332 connecting to the second wide portion 331, and each of the second wide portions 331 is installed with a second sucking disc 37, and a plurality of second push rods 39 is respectively inserted into the plurality of second stepped holes 33, and each of the second push rods 39 is capable of moving up and down along an axis of the second stepped hole 33 where the second push rod is positioned therein; the lower alignment platform 3 further comprises a plurality of second air holes 31, penetrating upper and lower surfaces thereof, and being arranged in array, and the second wide portion 331 of each of the second stepped holes 33 is installed with a second fitting seat 35, and the second sucking disc 37 is installed on the second fitting seat 35; the second fitting seat 35 comprises a second central hole 351, and the second central hole 351 and the second stepped hole 33 are connected.

The first air holes 11 and the second air holes 31 are respectively connected to a vacuum device (not shown). By vacuuming the first air holes 11, the upper substrate can be sucked on the upper alignment platform 1; by vacuuming the second air holes 31, the lower substrate can be sucked on the lower alignment platform 3.

The first fitting seats 15 and the second fitting seats 35 are respectively employed for installing the first sucking discs 17 and the second sucking discs 37. The material of the first fitting seats 15 and the second fitting seats 35 is aluminum in general.

The first sucking discs 17 are employed to keep sucking the upper substrate after the pressure inside the first air holes 11 is returned to 1 atm; the second sucking discs 37 are employed to keep sucking the lower substrate after the pressure inside the second air holes 31 is returned to 1 atm.

One end of the first push rod 19 close to the first wide portion 131 of the first stepped hole 13 is connected to a first bearer 20, the other end is connected to a first servo step motor (shown in a block form and marked as "motor" in FIG. 6); one end of the second push rod 39 close to the second wide portion 331 of the second stepped hole 33 is connected to a second bearer 40, the other end is connected to a second servo step motor (shown in a block form and marked as "motor" in FIG. 6).

The first servo step motor and the second servo step motor can respectively drive the first push rods 19 and the second push rods 39 to move up and down and precisely control their displacements. After the upper and the lower substrates are aligned, the first push rods 19 are driven by the first servo step motor to move downward. The first push rods 19 penetrate out of the upper alignment platform 1 to push the upper substrate to be detached from the first sucking discs 17; the second push rods 39 are driven by the second servo step motor to move upward. The second push rods 39 penetrate out of the lower alignment platform 3 to push the lower substrate to be detached from the second sucking discs 37. The first push rods 19 and the second push rods 39 are synchronously moved by the first servo step motor and the second servo step motor. The displacements of all the first push rods 19 are exactly the same. The displacements of all the second push rods 39 are exactly the same. The pressures to the upper and the lower substrates are evenly distributed to prevent bends of the upper and the lower substrates occur, and accordingly, to raise the production yield of the panel display devices.

The first bearers 20 and the second bearers 40 can respectively prevent the first push rods 19 to scratch the upper substrate and prevent the second push rods 39 to scratch the lower substrate and provide certain buffer the forces.

Furthermore, the plurality of first stepped holes 13 and the plurality of second stepped holes 33 are respectively symmetrically arranged according to a center of the upper alignment platform 1 and symmetrically arranged according to a center of lower alignment platform 3.

The material of the first sucking discs 17 and the second sucking discs 37 is rubber.

The material of the first push rods 19 and the second push rods 39 is metal. Preferably, the material of the first push rods 19 and the second push rods 39 is stainless steel.

The shapes of the first bearers 20 and the second bearers 40 are all columns. The sectional appearances thereof can be rectangular circle, regular shape and et cetera. Preferably, the sectional appearances of the first bearers 20 and the second bearers 40 are circle; the material of the first bearers 20 and the second bearers 40 is elastic material. Preferably, the material of the first bearers 20 and the second bearers 40 is rubber.

Figure 9:
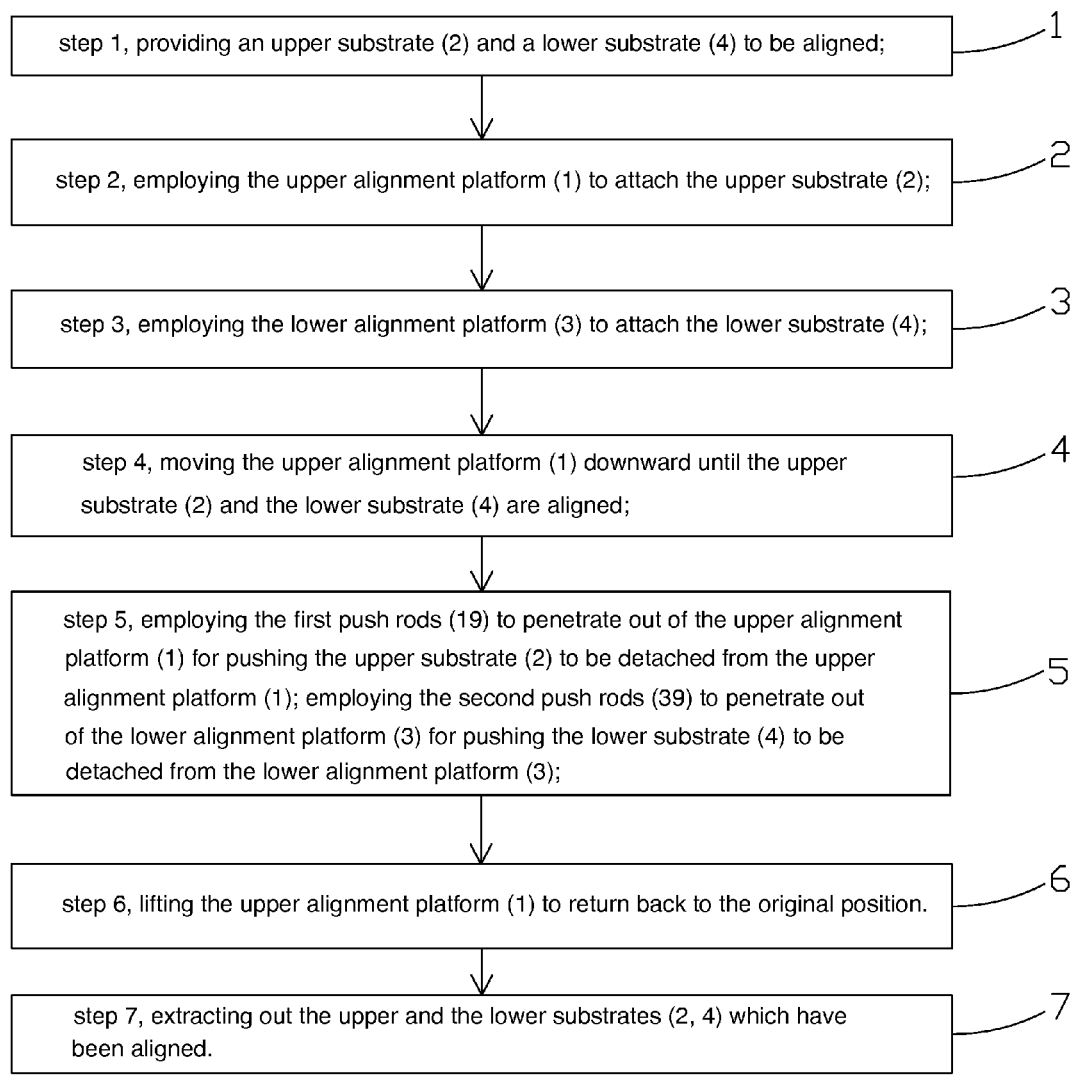
FIG. 9 is a flowchart of the sheet glass alignment method according to the present invention.

Please refer to FIG. 9, the aforesaid sheet glass alignment system can be utilized for implementing a sheet glass alignment method, comprising steps of:

step 1, providing an upper substrate 2 and a lower substrate 4 to be aligned.

step 2, employing the upper alignment platform 1 to attach the upper substrate 2.

The upper alignment platform 1 comprises a plurality of first stepped holes 13 penetrating upper and lower surfaces thereof, and each of the first stepped holes 13 comprises a first wide portion 131 facing the lower alignment platform 3 and a first narrow portion 132 connecting to the first wide portion 131, and each of the first wide portions 131 is installed with a first sucking disc 17, and a plurality of first push rods 19 is respectively inserted into the plurality of first stepped holes 13, and each of the first push rods 19 is capable of moving up and down along an axis of the first stepped hole 13 where the first push rod 19 is positioned therein; the upper alignment platform 1 further comprises a plurality of first air holes 11, penetrating upper and lower surfaces thereof, and being arranged in array, the first wide portion 131 of each of the first stepped holes 13 is installed with a first fitting seat 15, and the first sucking disc 17 is installed on the first fitting seat 15; the first fitting seat 15 comprises a first central hole 151, and the first central hole 151 and the first stepped hole 13 are connected; one end of the first push rod 19 close to the first wide portion 131 of the first stepped hole 13 is connected to a first bearer 20, the other end is connected to a first servo step motor.

Figure 10:
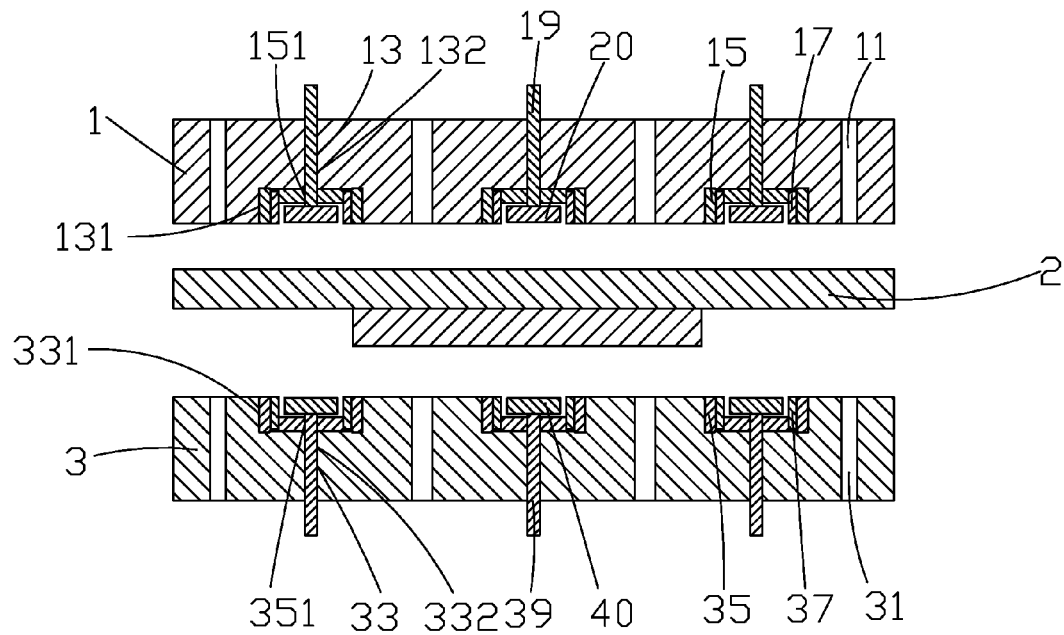
FIG. 10 to FIG. 12 are diagrams of step 2 of the sheet glass alignment method according to the present invention.
Figure 11:
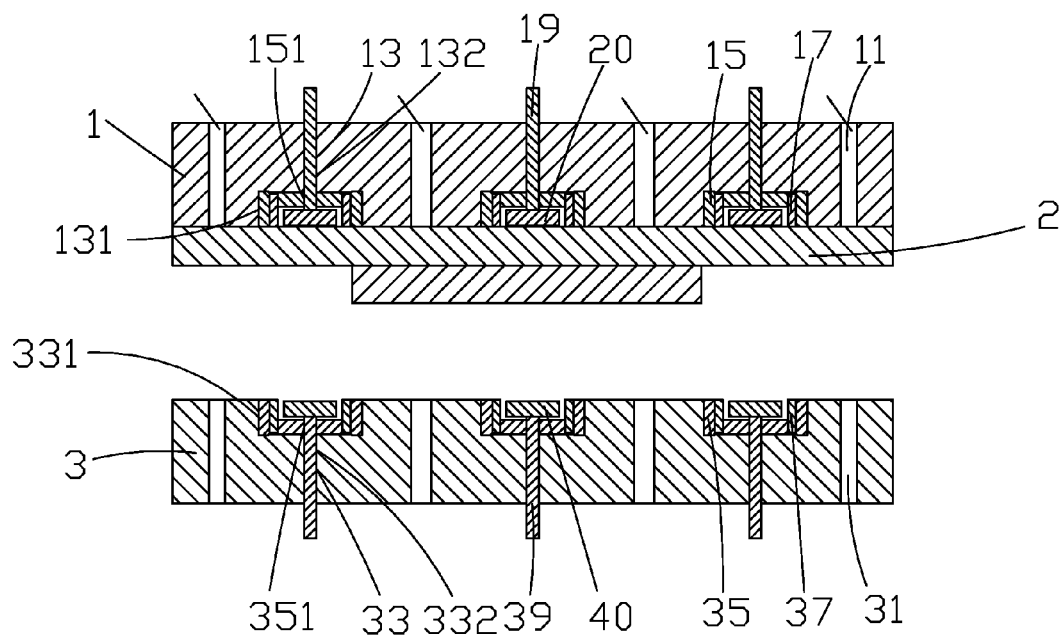
Figure 12:
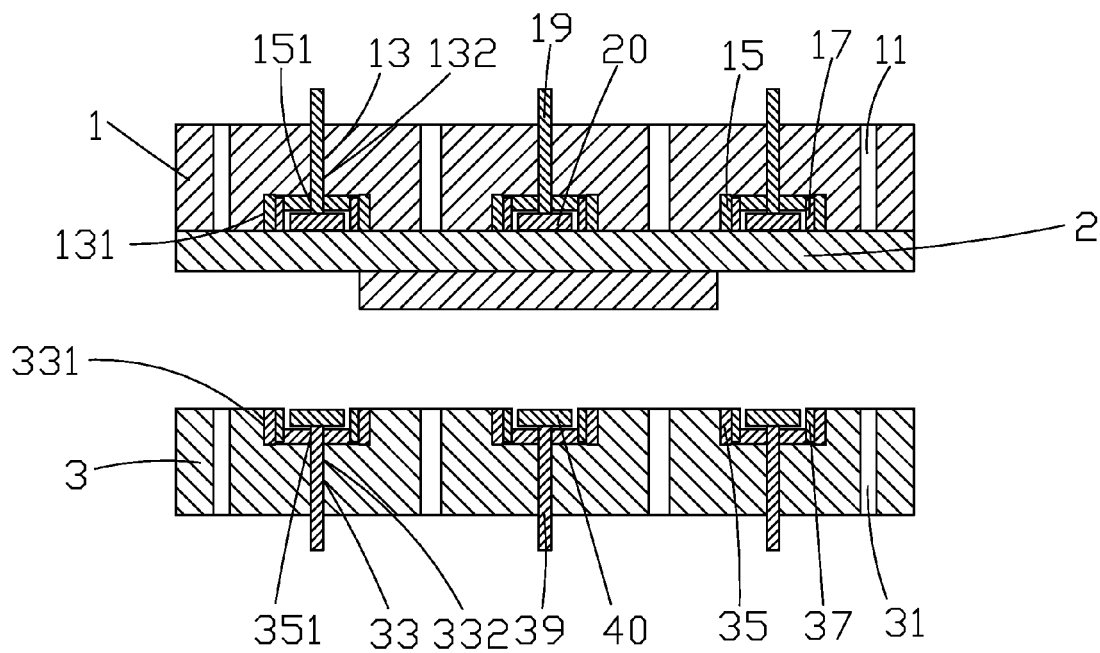

Please refer from FIG. 10 to FIG. 12. The specific implement of the step 2 is: a robot arm delivers the upper substrate 2 right below the upper alignment platform 1; and the robot arm lifts the upper substrate 2 upward, and meanwhile, the first air holes 11 are vacuumed to attach the upper substrate 2 to the upper alignment platform 1; finally, the first air holes 11 are charged to return to 1 atm, and the upper substrate 2 is attached by the first sucking discs 17 of the upper alignment platform 1.

step 3, employing the lower alignment platform 3 to attach the lower substrate 4.

The lower alignment platform 3 comprises a plurality of second stepped holes 33 penetrating upper and lower surfaces thereof, and each of the second stepped holes 33 comprises a second wide portion 331 facing the upper alignment platform 1 and a second narrow portion 332 connecting to the second wide portion 331, and each of the second wide portions 331 is installed with a second sucking disc 37, and a plurality of second push rods 39 is respectively inserted into the plurality of second stepped holes 33, and each of the second push rods 39 is capable of moving up and down along an axis of the second stepped hole 33 where the second push rod is positioned therein; the lower alignment platform 3 further comprises a plurality of second air holes 31, penetrating upper and lower surfaces thereof, and being arranged in array, and the second wide portion 331 of each of the second stepped holes 33 is installed with a second fitting seat 35, and the second sucking disc 37 is installed on the second fitting seat 35; the second fitting seat 35 comprises a second central hole 351, and the second central hole 351 and the second stepped hole 33 are connected; one end of the second push rod 39 close to the second wide portion 331 of the second stepped hole 33 is connected to a second bearer 40, the other end is connected to a second servo step motor.

Figure 13:
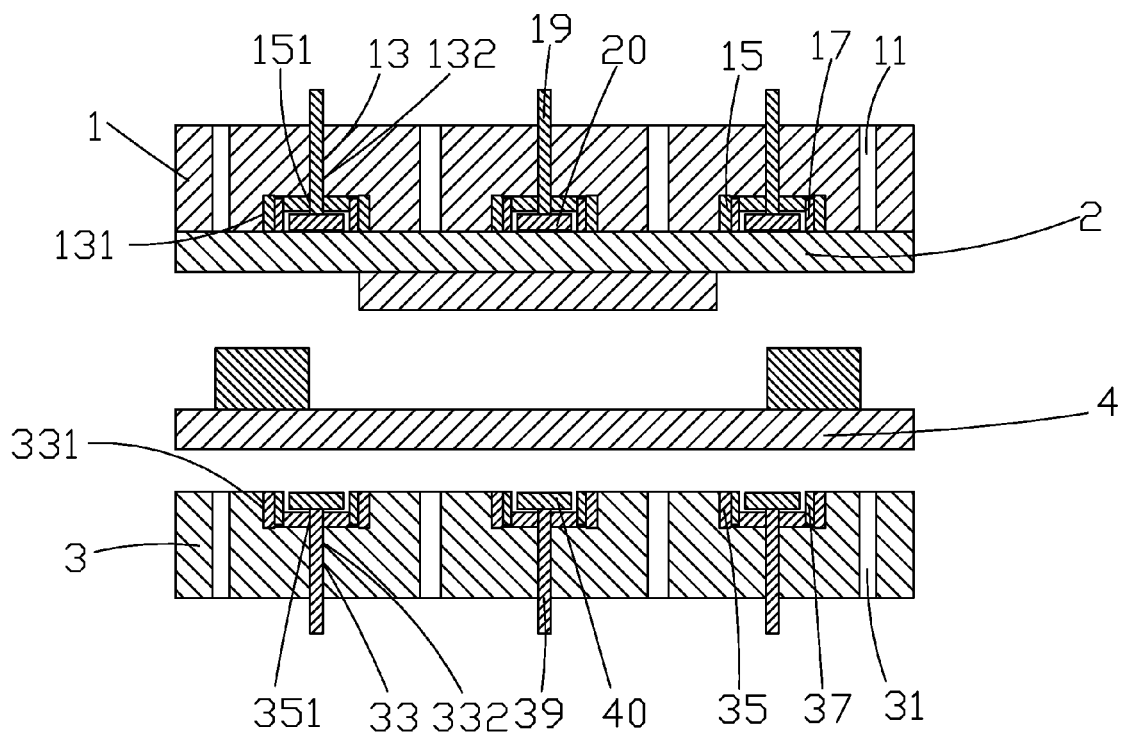
FIG. 13 to FIG. 15 are diagrams of step 3 of the sheet glass alignment method according to the present invention.
Figure 14:
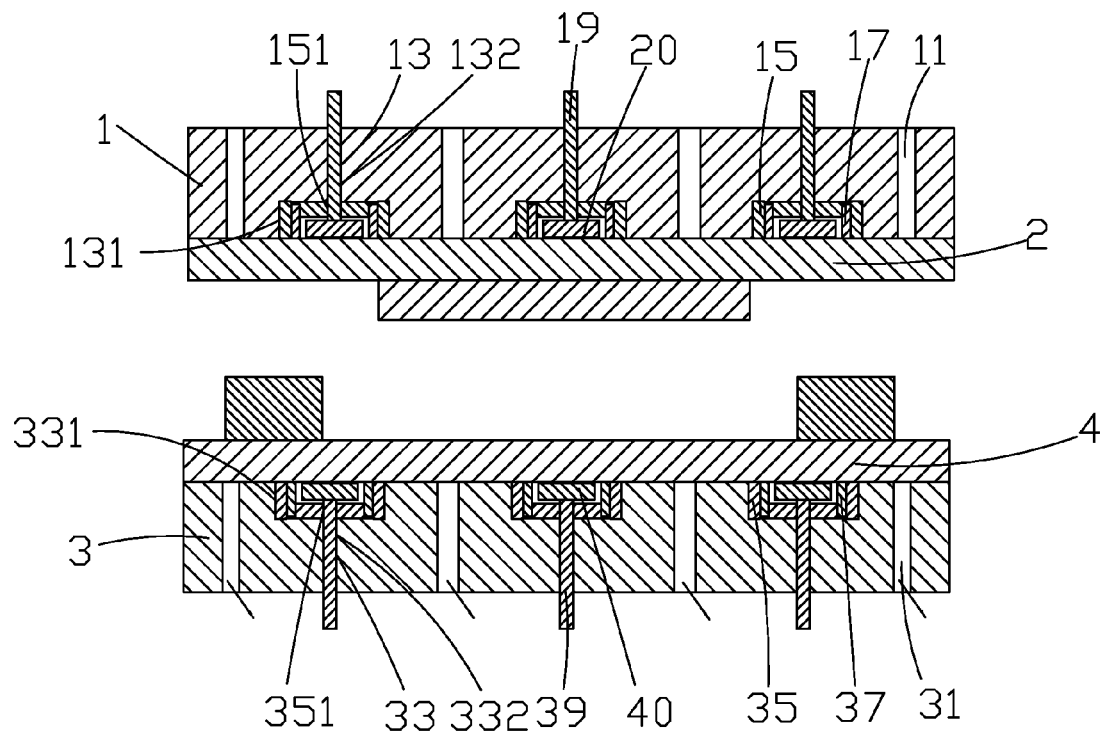
Figure 15:
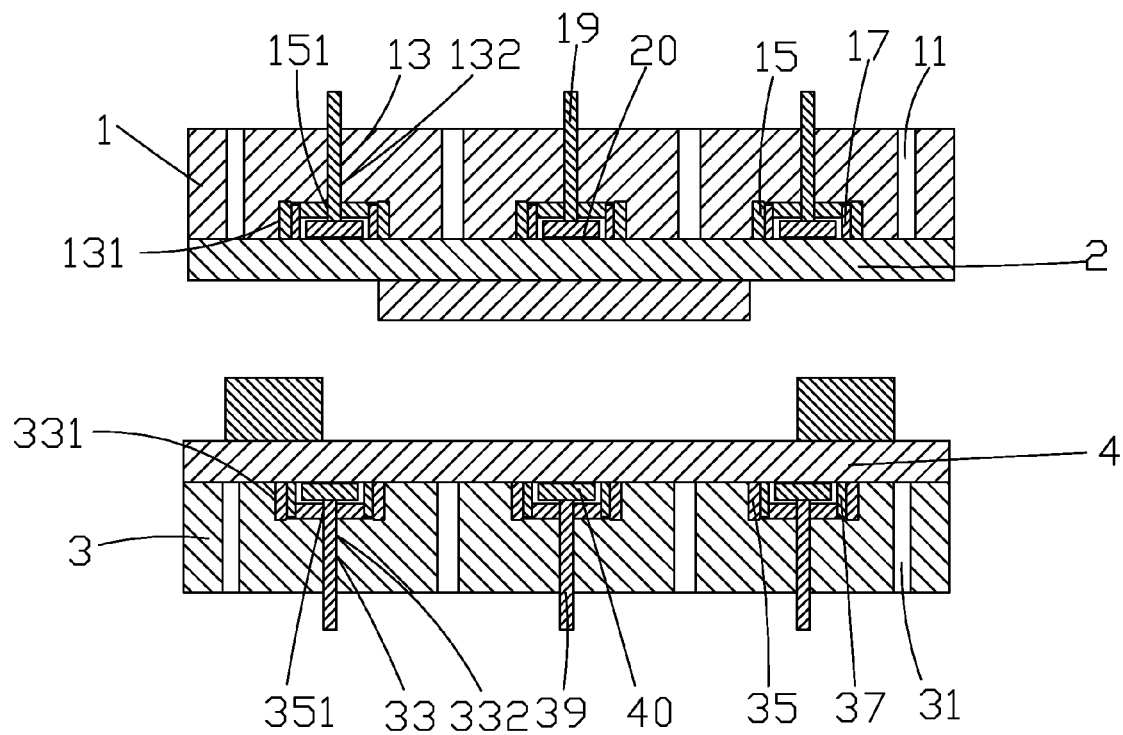
Figure 16:
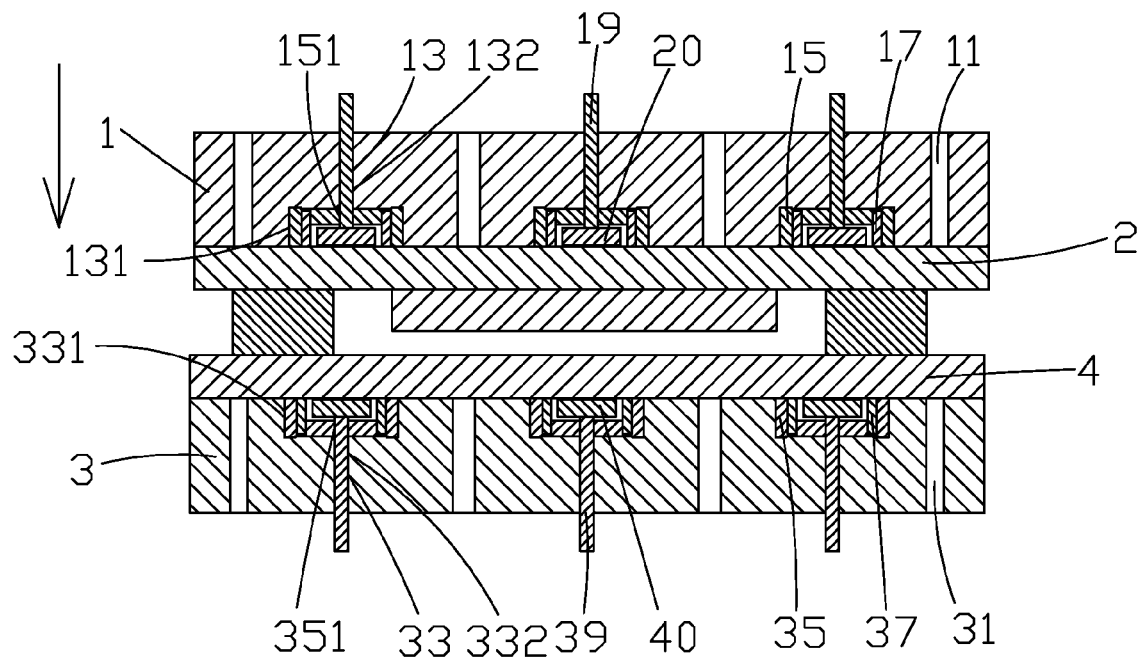
FIG. 16 is a diagram of step 4 of the sheet glass alignment method according to the present invention.
Figure 17:
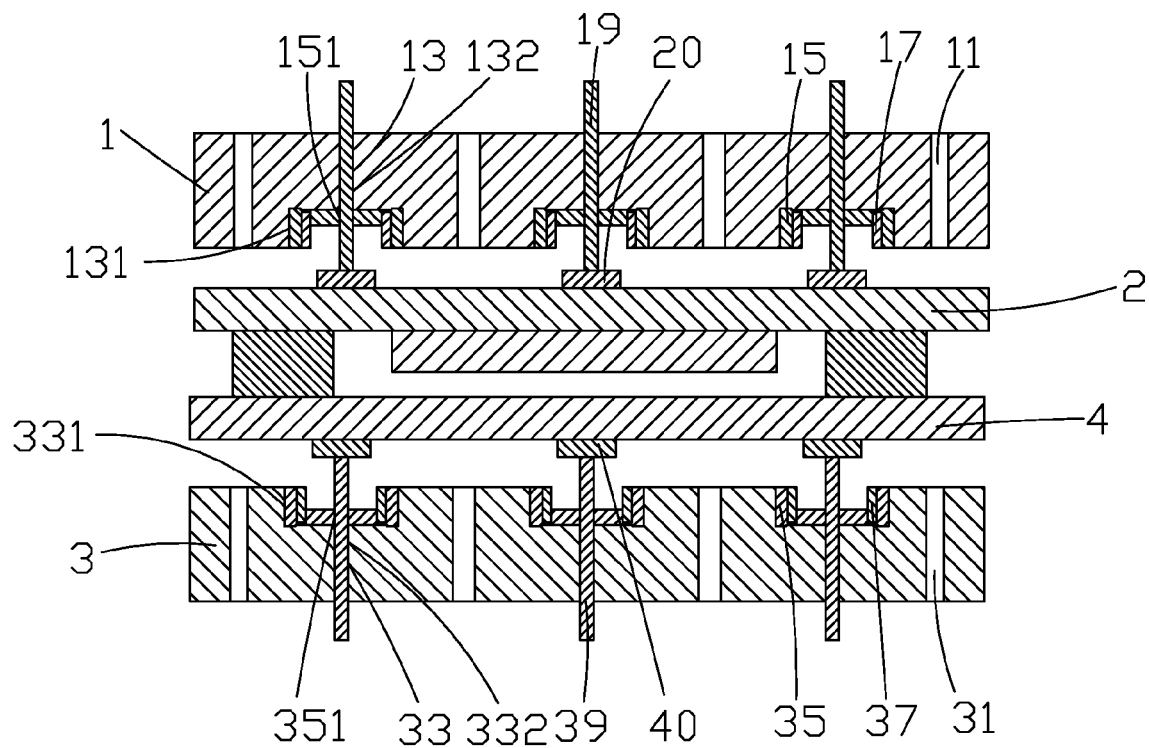
FIG. 17 is a diagram of step 5 of the sheet glass alignment method according to the present invention.

Please refer from FIG. 13 to FIG. 15. The specific implement of the step 3 is: a robot arm delivers the lower substrate 4 right above the lower alignment platform 3; and the robot arm descends the lower substrate 4 downward, and meanwhile, the second air holes 31 are vacuumed to attach the lower substrate 4 to the lower alignment platform 3; finally, the second air holes 31 are charged to return to 1 atm, and the lower substrate 4 is attached by the second sucking discs 37 of the lower alignment platform 3.

step 4, as shown in FIG. 16, slowly moving the upper alignment platform 1 downward until the upper substrate 2 and the lower substrate 4 are aligned.

step 5, as shown in FIG. 17, employing the first push rods 19 to penetrate out of the upper alignment platform 1 for pushing the upper substrate 2 to be detached from the upper alignment platform 1; employing the second push rods 39 to penetrate out of the lower alignment platform 3 for pushing the lower substrate 4 to be detached from the lower alignment platform 3.

Specifically, by activating the first servo step motor, the first servo step motor precisely drives the first push rods 19 to move downward with a certain displacement and to penetrate out of the upper alignment platform 1 to push the upper substrate 2 to be detached from the first sucking discs 17; by activating the second servo step motor, the second servo step motor precisely drives the second push rods 39 to move upward with a certain displacement and to penetrate out of the lower alignment platform 3 to push the lower substrate to be detached from the second sucking discs 37.

In the step 5, by precisely controlling the displacements of the first push rods 19 and the second push rods 39 by the first and the second servo step motors to push the upper and the lower substrates 2, 4 to be detached from the first and the second sucking discs 17, 37, i.e. the upper and the lower substrates 2, 4 which have been aligned are mechanically detached from the upper and the lower alignment platforms 1, 3. Because the first push rods 19 and the second push rods 39 are respectively synchronously moved by the first servo step motor and the second servo step motor. The displacements of all the first push rods 19 and the displacements of all the second push rods 39 can be exactly the same. The pressures to the upper and the lower substrates can be evenly distributed to prevent bends of the upper and the lower substrates occur, and accordingly, to raise the production yield of the panel display devices.

step 6, lifting the upper alignment platform 1 to return back to the original position.

step 7, extracting out the upper and the lower substrates 2, 4 which have been aligned.

In conclusion, according to the sheet glass alignment system provided by the present invention, by providing a plurality of push rods to replace the rubber elements for bubbling to make the pressure is evenly distributed when the upper and the lower substrates are detached from the alignment platforms for raising the production yield of the panel display devices.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A sheet glass alignment system, comprising: an upper alignment platform and a lower alignment platform which are oppositely located, wherein the upper alignment platform is movable up and down relative to the lower alignment platform;

wherein the upper alignment platform comprises a plurality of first stepped holes penetrating upper and lower surfaces of the upper alignment platform, and each of the first stepped holes comprises a first wide portion facing the lower alignment platform and a first narrow portion connecting to the first wide portion, and each of the first wide portions is installed with a first sucking disc, and a plurality of first push rods is respectively inserted into the plurality of first stepped holes, and each of the first push rods is movable up and down along an axis of the first stepped hole in which each of the first push rods is positioned between a first projecting position where one end of the first push rod that is close to the first wide portion of the first stepped hole projects out of the first stepped hole and extends beyond the lower surface of the upper alignment platform and a first retracted position where the one end of the first push rod is retracted back into the first stepped hole;

wherein the lower alignment platform comprises a plurality of second stepped holes penetrating upper and lower surfaces of the lower alignment platform, and each of the second stepped holes comprises a second wide portion facing the upper alignment platform and a second narrow portion connecting to the second wide portion, and each of the second wide portions is installed with a second sucking disc, and a plurality of second push rods is respectively inserted into the plurality of second stepped holes, and each of the second push rods is movable up and down along an axis of the second stepped hole in which each of the second push rods is positioned between a second projecting position where one end of the second push rod that is close to the second wide portion of the second stepped hole projects out of the second stepped hole and extends beyond the upper surface of the lower alignment platform and a second retracted position where the one end of the second push rod is retracted back into the second stepped hole;

wherein in the first projecting position, the one end of each of the first push rods is spaced from the lower surface of the upper alignment platform by a first predetermined distance and is separate from the first sucking disc; and in the second projecting position, the one end of each of the second push rods is spaced from the upper surface of the lower alignment platform by a second predetermined distance and is separate from the second sucking disc; and wherein the one end of each of the first push rods close to the first wide portion of the first stepped hole is connected to a first bearer and the other end of the first push rod is connected to a first servo step motor, the first bearer being expanded with respect to and having a size larger than the one end of each of the first push rods so as to provide an increased surface area for contact engagement with a substrate; and the one end of each of the second push rods close to the second wide portion of the second stepped hole is connected to a second bearer and the other end of the second push rod is connected to a second servo step motor, the second bearer being expanded with respect to and having a size larger than the one end of each of the second push rods so as to provide an increased surface area for contact engagement with a substrate.

2. The sheet glass alignment system according to claim 1, wherein the plurality of first stepped holes is symmetrically arranged according to a center of the upper alignment platform; the plurality of second stepped holes is symmetrically arranged according to a center of the lower alignment platform.

3. The sheet glass alignment system according to claim 1, wherein a material of the first and the second push rods is stainless steel, and a material of the first and the second bearers is plastic, and a material of the first and the second sucking discs is rubber.

4. A sheet glass alignment system, comprising: an upper alignment platform and a lower alignment platform which are oppositely located, wherein the upper alignment platform is movable up and down relative to the lower alignment platform;
   wherein the upper alignment platform comprises a plurality of first stepped holes penetrating upper and lower surfaces of the upper alignment platform, and each of the first stepped holes comprises a first wide portion facing the lower alignment platform and a first narrow portion connecting to the first wide portion, and each of the first wide portions is installed with a first sucking disc, and a plurality of first push rods is respectively inserted into the plurality of first stepped holes, and each of the first push rods is movable up and down along an axis of the first stepped hole in which each of the first push rods is positioned between a first projecting position where one end of the first push rod that is close to the first wide portion of the first stepped hole projects out of the first stepped hole and extends beyond the lower surface of the upper alignment platform and a first retracted position where the one end of the first push rod is retracted back into the first stepped hole;
   wherein the lower alignment platform comprises a plurality of second stepped holes penetrating upper and lower surfaces of the lower alignment platform, and each of the second stepped holes comprises a second wide portion facing the upper alignment platform and a second narrow portion connecting to the second wide portion, and each of the second wide portions is installed with a second sucking disc, and a plurality of second push rods is respectively inserted into the plurality of second stepped holes, and each of the second push rods is movable up and down along an axis of the second stepped hole in which each of the second push rods is positioned between a second projecting position where one end of the second push rod that is close to the second wide portion of the second stepped hole projects out of the second stepped hole and extends beyond the upper surface of the lower alignment platform and a second retracted position where the one end of the second push rod is retracted back into the second stepped hole;
   wherein the upper alignment platform further comprises a plurality of first air holes, penetrating the upper and lower surfaces of the upper alignment platform, and being arranged in an array, the first wide portion of each of the first stepped holes being installed with a first fitting seat, the first sucking disc being installed on the first fitting seat; and the first fitting seat comprises a first central hole, which is in communication with the first stepped hole;
   wherein the lower alignment platform further comprises a plurality of second air holes, penetrating the upper and lower surfaces of the lower alignment platform, and being arranged in an array, the second wide portion of each of the second stepped holes being installed with a second fitting seat, the second sucking disc being installed on the second fitting seat; and the second fitting seat comprises a second central hole, which is in communication with the second stepped hole;
   wherein in the first projecting position, the one end of each of the first push rods is spaced from the lower surface of the upper alignment platform by a first predetermined distance and is separate from the first sucking disc; and in the second projecting position, the one end of each of the second push rods is spaced from the upper surface of the lower alignment platform by a second predetermined distance and is separate from the second sucking disc; and
   wherein the one end of each of the first push rods close to the first wide portion of the first stepped hole is connected to a first bearer and the other end of the first push rod is connected to a first servo step motor, the first bearer being expanded with respect to and having a size larger than the one end of each of the first push rods so as to provide an increased surface area for contact engagement with a substrate; and the one end of each of the second push rods close to the second wide portion of the second stepped hole is connected to a second bearer and the other end of the second push rod is connected to a second servo step motor, the second bearer being expanded with respect to and having a size larger than the one end of each of the second push rods so as to provide an increased surface area for contact engagement with a substrate.

5. The sheet glass alignment system according to claim 4, wherein the plurality of first stepped holes is symmetrically arranged according to a center of the upper alignment platform; the plurality of second stepped holes is symmetrically arranged according to a center of the lower alignment platform.

6. The sheet glass alignment system according to claim 4, wherein a material of the first and the second push rods is stainless steel.

7. The sheet glass alignment system according to claim 4, wherein a material of the first and the second bearers is plastic.

8. The sheet glass alignment system according to claim 4, wherein a material of the first and the second sucking discs is rubber.

* * * * *